United States Patent [19]
Ueda et al.

[11] Patent Number: 5,472,778
[45] Date of Patent: Dec. 5, 1995

[54] MAGNETIC RECORDING MEDIUM

[75] Inventors: Kunihiro Ueda; Takayoshi Kobuke, both of Tokyo, Japan

[73] Assignee: TDK Corporation, Tokyo, Japan

[21] Appl. No.: 150,770

[22] Filed: Nov. 12, 1993

Related U.S. Application Data

[63] Continuation of Ser. No. 884,199, May 19, 1992, abandoned.

[30] Foreign Application Priority Data

May 17, 1991 [JP] Japan ................................. 3-141188
Apr. 17, 1992 [JP] Japan ................................. 4-124340

[51] Int. Cl.$^6$ .............................. B32B 5/16; G11B 5/66; B05D 5/12
[52] U.S. Cl. ................... 428/332; 428/336; 428/447; 428/463; 428/694 TF; 428/694 T; 428/694 TS; 428/694 TP; 428/694 TZ; 428/702; 427/127; 427/128; 427/130; 427/131; 427/132
[58] Field of Search .................... 428/611, 702, 428/469, 900, 694 J, 694 TS, 694 TP, 694 TF, 694 TZ, 447, 332, 336; 427/127, 128, 130, 131, 132

[56] References Cited

U.S. PATENT DOCUMENTS

| | | | |
|---|---|---|---|
| 4,548,864 | 10/1985 | Nakayama et al. | 428/336 |
| 4,599,266 | 7/1986 | Nakayama | 428/336 |
| 4,647,494 | 3/1987 | Meyerson et al. | 428/216 |
| 4,661,420 | 4/1987 | Nakamura et al. | 428/692 |
| 4,775,576 | 10/1988 | Bouchand et al. | 428/216 |

FOREIGN PATENT DOCUMENTS

| | | |
|---|---|---|
| 59-72653 | 4/1984 | Japan . |
| 59-154641 | 9/1984 | Japan . |
| 60-219626 | 11/1985 | Japan . |
| 61-22420 | 1/1986 | Japan . |
| 63-10315 | 1/1988 | Japan . |

*Primary Examiner*—L. Kiliman
*Attorney, Agent, or Firm*—Oblon, Spivak, McClelland, Maier, & Neustadt

[57] ABSTRACT

A magnetic recording medium having a magnetic layer in the form of a ferromagnetic metal thin film includes an undercoat film disposed between the magnetic layer and the substrate and a topcoat film on the magnetic layer. Each of the undercoat and topcoat films is a plasma polymerized film containing silicon, the Si content in the film being 30 to 50 at %. Corrosion resistance and durability are significantly improved.

5 Claims, No Drawings

MAGNETIC RECORDING MEDIUM

This application is a Continuation of application Ser. No. 07/884,199, filed on May 18, 1992, now abandoned.

FIELD OF THE INVENTION

This invention relates to a magnetic recording medium having a ferromagnetic metal thin film.

BACKGROUND OF THE INVENTION

The recent trend of magnetic tape is toward increasing density. Among others, research efforts are concentrated on magnetic tape having a ferromagnetic metal thin film based on cobalt and having nickel or the like added because of its high saturation magnetic flux density and coercivity.

Magnetic tape of this type is prepared by a variety of methods although advantageous methods proposed heretofore are by forming a ferromagnetic metal thin film as a mono-layer film on a non-magnetic substrate by an oblique evaporation technique and by depositing two or more layers to form a multilayer structure.

The non-magnetic substrates used for magnetic tape are generally resin films of polyethylene terephthalate or the like.

Where a magnetic layer is formed on such a resin film by evaporation, moisture and air can penetrate through the resin film to corrode the magnetic layer, degrading electromagnetic properties upon recording and reproducing. Also durability is insufficient.

One solution to this problem is to form a plasma polymerized film of 20 to 270 Å thick on the magnetic layer as disclosed in Japanese Patent Application Kokai (JP-A) Nos. 72653/1984 and 154641/1984.

Also JP-A 219626/1985 discloses to form a plasma polymerized fluoride film on the magnetic layer.

None of these proposals achieved sufficient rust prevention since the film formed as a topcoat film on the magnetic layer could not prevent entry of moisture or the like through the substrate.

Particularly, the plasma polymerized fluoride film has too weak quality to provide durability. It may occur to coat lubricant in order to compensate for such a loss of durability, but the plasma polymerized film repels the coating solvent. Due to the loss of affinity between the plasma polymerized film and the lubricant, a lubricant layer cannot be provided.

Further, JP-A 22420/1986 proposes the use of a plasma polymerized film as both a topcoat film and a backcoat film on the rear surface of the substrate.

However, the provision of such a backcoat film gives no more than the rust preventing effect available with only the topcoat film.

Therefore, these prior art methods are insufficient in shutting off moisture, oxygen or the like and thus in corrosion resistance and durability. In particular, the cupping problem that magnetic tape is transversely warped due to rust generation is rigorous because cupping degrades head touch, causing poor travel performance.

SUMMARY OF THE INVENTION

A primary object of the present invention is to significantly improve the corrosion resistance and durability of a magnetic recording medium having a ferromagnetic metal thin film as the magnetic layer.

This and other objects are achieved by the present invention defined below as (1) to (8).

(1) A magnetic recording medium comprising an undercoat film, a ferromagnetic metal thin film, and a topcoat film on a non-magnetic resin substrate, wherein each of said undercoat film and said topcoat film is a plasma polymerized film containing silicon, the Si content in the film being 30 to 50 at %.

(2) The magnetic recording medium of (1) wherein both the plasma polymerized films contain oxygen.

(3) The magnetic recording medium of (2) wherein said plasma polymerized film contains oxygen and silicon in an atomic ratio O/Si of from 1.2 to 1.95.

(4) The magnetic recording medium of (2) wherein said plasma polymerized film is formed by feeding an alkoxysilane compound and oxygen gas as reactants at a flow rate ratio of alkoxysilane compound to oxygen of from 0.1 to 0.6.

(5) The magnetic recording medium of any one of (1) to (4) wherein said undercoat film is 100 to 1000 Å thick.

(6) The magnetic recording medium of any one of (1) to (4) wherein said topcoat film is 10 to 100 Å thick.

(7) The magnetic recording medium of (2) wherein said plasma polymerized film has an index of refraction of 1.44 to 1.55.

(8) The magnetic recording medium of (1) wherein said ferromagnetic metal thin film is predominantly comprised of cobalt and formed by an oblique evaporation technique.

DETAILED DESCRIPTION OF THE INVENTION

The illustrative construction of the present invention is described in further detail. The magnetic recording medium of the present invention is embodied as a magnetic tape.

Non-Magnetic Substrate

The material of the non-magnetic substrate used herein is not particularly limited and use may be made of various films which can withstand heat during ferromagnetic metal thin film evaporation, for example, films of polyethylene terephthalate or the like. Also employable are the materials disclosed in JP-A 10315/1988.

Undercoat Film and Topcoat Film

In accordance with the present invention, in order that a magnetic layer to be described later be interposed on its upper and lower sides, that is, to provide a sandwich structure, an undercoat film is provided between the substrate and the magnetic layer and a topcoat film is provided on the magnetic layer.

Each of the undercoat film and the topcoat film used herein is a plasma polymerized film which contains silicon and additionally, carbon, hydrogen and oxygen. The Si content in the film ranges from 30 to 50 at %, preferably from 35 to 45 at %.

By forming the undercoat and topcoat films of the above-defined composition having a Si content in the above-defined range, great rust preventing effect is exerted to achieve the benefits of the invention.

More particularly, by providing plasma polymerized films above and below the magnetic layer, the magnetic layer can be shut off from moisture and oxygen on upper and lower sides thereof.

Plasma polymerized films must be formed both above and below the magnetic layer before the benefits of the present invention can be achieved. The benefits are not obtained by forming a plasma polymerized film only above or below the magnetic layer as disclosed in JP-A 726253/1984 and 154641/1984.

With a Si content of less than 30 at %, the film is reduced in density, becoming less effective in shutting off moisture and oxygen. A Si content in excess of 50 at % also causes a reduction in density and allows the film to crack during formation.

In a preferred embodiment, the film has a C content of up to 5 at %, especially 0 to 1 at %, a H content of up to 5 at %, especially 0 to 1 at %, and a O content of up to 70 at %, especially 60 to 65 at %. In some cases, N or the like may be contained.

Preferably, the atomic ratio of oxygen to silicon, O/Si, is from 1.2 to 1.95, especially from 1.6 to 1.85.

Better results are obtained by restricting C, H, O, etc. in the film as defined above and O/Si to the above-defined range.

Namely, the plasma polymerized film having a nearly inorganic material composition is effective in fully shielding oxygen and moisture, achieving satisfactory rust prevention even in a high-temperature, high-humidity environment.

Understandably, the contents of Si, O, C, H and other elements in the plasma polymerized film may be determined by secondary ion mass spectroscopy (SIMS), Auger electron spectroscopy (AES) or the like.

In the case of SIMS, determination may be made by counting Si or the like at the surface of the plasma polymerized film or alternatively, by measuring a profile of Si or the like while ion etching with Ar or the like. For SIMS measurement, reference may be made to Surface Science Fundamental Lectures, Vol. 3, "Basis and Application of Surface Analysis", chapter "SIMS and LAMMA", page 70 (1984).

The plasma polymerized films used herein may have an index of refraction of 1.44 to 1.55, more preferably 1.45 to 1.50. By controlling the index of refraction to this range, the film composition becomes optimum to enhance the benefits of the invention. For the measurement of index of refraction, an ellipsometer may be used.

The reactant source from which the plasma polymerized films are formed may be selected from various sources containing silicon, carbon, hydrogen and oxygen. More particularly, organic silicon compounds which are gas or liquid at room temperature are used, including silanes and siloxanes, for example, tetramethoxysilane (TMOS), tetraethoxysilane (TEOS), trimethylmethoxysilane and trimethylchlorosilane. In order to form a film having a silicon content within the specific range, a reactant gas mixture of at least one organic silicon compound and an appropriate amount of at least one organic reactant gas is preferably used.

Examples of the organic reactant gas include $O_2$, $O_3$, $H_2O$, NOx such as NO, $N_2O$ and $NO_2$, CO, and $CO_2$ as an oxygen source, and $N_2$, NOx, and $NH_3$ as a nitrogen source. Among others, use of $O_2$ as an oxygen source is preferred.

In the practice of the present invention, plasma polymerized films are preferably formed by using an alkoxysilane compound such as tetramethoxysilane, tetraethoxysilane, and trimethoxysilane, adding oxygen gas thereto to form a reactant gas mix, feeding the gas mix at a flow rate ratio of alkoxysilane compound to oxygen gas of from 0.1 to 0.6, more preferably from 0.12 to 0.55.

With this choice of reactants, there is formed a plasma polymerized film having such a composition approximate to inorganic material that moisture and oxygen are fully shut out, resulting in satisfactory rust prevention.

The plasma polymerized films formed from such reactants may be 100 to 1000 Å thick, especially 200 to 700 Å thick when they are used as the undercoat film. The benefits of the invention are quite outstanding at a film thickness within this range. The benefits of the invention would become less at a film thickness of less than 100 Å whereas a film thickness of more than 1000 Å would be disadvantageous for large scale manufacture. An excessive film thickness gives no further improvement and would rather allow the undercoat layer to crack, becoming less effective in water and oxygen blocking.

The plasma polymerized films may be 10 to 100 Å thick, especially 20 to 80 Å thick when they are used as the topcoat film. The benefits of the invention are quite outstanding at a film thickness within this range. From the standpoint of rust prevention, the topcoat film need not be as thick as the undercoat film because the topcoat film is usually formed on an oxidized surface layer of the magnetic layer. Also this range avoids the spacing loss problem. With a film thickness in excess of 100 Å, the benefits of the invention would critically lower and the spacing loss problem would become noticeable. Since an increased film thickness requires long time exposure of the magnetic layer to plasma at high power, the magnetic layer can be damaged. The benefits of the invention would become less at a film thickness of less than 10 Å.

It will be understood that the film thickness may be measured using an ellipsometer or the like. Such film thickness control may be performed by limiting the reaction time, reactant gas flow rate and other factors during formation of plasma polymerized films.

The plasma polymerized films are formed in a conventional well-known manner by contacting a discharge plasma of the reactant gas with a substrate or magnetic layer to form a polymer film thereon. The electrode arrangement, applied current, treating time, operating pressure and other conditions are as usual.

It is to be noted that Ar, $N_2$, He, $H_2$ or the like may be used as the carrier gas. The plasma generating source may be microwave discharge, DC discharge and AC discharge as well as RF discharge.

In forming undercoat and topcoat films in accordance with the invention, a plasma polymerized film is preferably formed on a substrate or magnetic layer, especially on a plasma-treated substrate or magnetic layer. Plasma treatment of a substrate or magnetic layer on the surface improves the bonding force of the substrate or magnetic layer and hence, the adhesion of the plasma polymerized film to the substrate or magnetic layer. The principle, technique and conditions of the plasma treatment of a substrate or magnetic layer are basically the same as those of the plasma polymerization mentioned above.

The difference is that the plasma treatment uses in principle an inorganic gas as the treating gas whereas the formation of plasma polymerized film by the plasma polymerization technique uses in principle an organic gas (optionally containing an inorganic gas) as the reactant gas. No particular limit is imposed on the frequency of the plasma treatment power supply which may be DC, AC or microwave.

Since the present invention uses undercoat and topcoat films each in the form of a plasma polymerized film to form a sandwich structure as mentioned above, it need not use another undercoat film or protective film. As the case may be, however, another undercoat film or protective film may be used additionally.

Magnetic Layer

The magnetic layer used herein consists of one or more ferromagnetic metal thin films which are preferably comprised predominantly of cobalt and formed by an oblique evaporation technique. The benefits of the invention becomes outstanding with such a magnetic layer.

The oblique evaporation technique is, for example, by unravelling a length of film-shaped non-magnetic substrate from a supply roll, feeding the substrate along the surface of a rotating chill drum while depositing evaporated metal from at least one stationary metal source on the substrate at an angle, and winding the substrate on a takeup roll.

Provided that θ is the angle included between the incident angle of a ferromagnetic metal component during film formation and a normal to the substrate, θ varies over the range of from θmax at the initial to θmin at the end within which evaporation is carried out. For the evaporation of a ferromagnetic metal thin film, it is preferred to have θmax in the range of 80° to 90° and θmin in the range of 10° to 60°.

The ferromagnetic metal thin film or films which constitute the magnetic layer are preferably of Co—Ni alloys containing nickel, especially Co—Ni alloys containing at least 80 % of Co and up to 20% of Ni in molar ratio.

Additionally, up to 10% of chromium may be contained if desired, and any of metals as disclosed in JP-A 10315/1988 and other metal components may also be present.

Moreover, corrosion resistance may be enhanced if desired by admitting a minor amount of oxygen into a surface layer of the respective layers or interposing a non-magnetic layer therebetween.

The entire magnetic layer preferably has a thickness of about 1200 to about 3000 Å, at which fully increased outputs are expectable.

The incident angle of evaporating metal particles continuously varies from θmax at the initial to θmin at the end of evaporation whereby prismatic crystal grains of Co base ferromagnetic metal grow unidirectionally on a non-magnetic substrate surface to form an arcuate array. This procedure may be repeated if a magnetic layer including multiple sub-layers is desired.

Understandably, any of other supplements such as a backcoat layer may be added to the present invention.

EXAMPLE

Examples of the present invention are given below by way of illustration.

EXAMPLE 1

By unravelling a polyethylene terephthalate base of 7 μm thick from a supply roll, moving the base along the periphery of a rotating cylindrical chill drum, establishing a vacuum of $10^{-4}$ Pa, feeding tetramethoxysilane (TMOS) and $O_2$ as a reactant gas mix, and effecting plasma polymerization, an undercoat film was formed on the PET base. The plasma polymerization conditions included a flow rate of TMOS of 3 SCCM (standard cubic centimeter), a flow rate of $O_2$ of 20 SCCM, an operating pressure of 0.05 Torr, a plasma power of 50 W, and a plasma frequency of 100 kHz.

The undercoat film was 300 Å thick. The thickness of the plasma polymerized film was measured using an ellipsometer. Also with the ellipsometer, it had an index of refraction of 1.47. The film had a silicon content of 35 at % and a O/Si ratio of 1.85. The silicon and oxygen contents were analyzed by AES.

By unravelling the undercoat film-bearing PET base from its supply roll in an argon atmosphere at $10^{-4}$ Pa, moving the base along the periphery of a rotating cylindrical chill drum, obliquely depositing a 20 at % Ni—Co alloy on the base at an incident angle to form a ferromagnetic metal thin film, and winding the base on a takeup roll.

By reversing the takeup roll to a supply roll and obliquely depositing the ferromagnetic metal on the PET base in an incident direction which intersected the incident direction of the first oblique evaporation with respect to a normal to the PET base surface, there was completed a magnetic layer of two sub-layer structure.

Thereafter, a topcoat film was formed on the magnetic layer by effecting plasma polymerization using TMOS and $O_2$ as a reactant gas mix. The plasma polymerization conditions included a flow rate of TMOS of 3 SCCM, a flow rate of $O_2$ of 20 SCCM, an operating pressure of 0.05 Torr, a plasma power of 50 W, and a plasma frequency of 100 kHz.

The topcoat film had a thickness of 50 Å and an index of refraction of 1.47. The film had a silicon content of 35 at % and a O/Si ratio of 1.85.

This magnetic recording medium is designated Sample No. 1.

Sample No. 2 was prepared by the same procedure as Sample No. 1 except that the topcoat film was omitted.

Sample No. 3 was prepared by the same procedure as Sample No. 1 except that the undercoat film was omitted.

Sample No. 4 was prepared by the same procedure as Sample No. 1 except that the undercoat and topcoat films were omitted.

Sample No. 5 was prepared by the same procedure as Sample No. 1 except that the undercoat and topcoat films were plasma polymerized under the following conditions.

The undercoat film was formed under plasma polymerization conditions including a flow rate of TMOS of 20 SCCM, a flow rate of $O_2$ of 20 SCCM, an operating pressure of 0.05 Torr, a plasma power of 10 W, and a plasma frequency of 100 kHz. It had a thickness of 300 Å, an index of refraction of 1.30, a silicon content of 55 at %, and a O/Si ratio of 1.1.

The topcoat film was formed under the same plasma polymerization conditions as just mentioned above. It had a thickness of 30 Å, an index of refraction of 1.30, a silicon content of 55 at %, and a O/Si ratio of 1.1.

Sample No. 6 was prepared by the same procedure as Sample No. 1 except that the topcoat film was formed to a thickness of 5 Å under plasma polymerization conditions including a flow rate of TMOS of 3 SCCM, a flow rate of $O_2$ of 20 SCCM, an operating pressure of 0.05 Torr, a plasma power of 50 W, and a plasma frequency of 100 kHz.

Sample No. 7 was prepared by the same procedure as Sample No. 1 except that the undercoat film was formed to a thickness of 50 Å under plasma polymerization conditions including a flow rate of TMOS of 3 SCCM, a flow rate of $O_2$ of 20 SCCM, an operating pressure of 0.05 Torr, a plasma power of 50 W, and a plasma frequency of 100 kHz.

Sample No. 8 was prepared by the same procedure as

Sample No. 1 except that the undercoat film was formed using TMOS, $O_2$ and $CH_4$ as a reactant gas mixture under plasma polymerization conditions including a flow rate of TMOS of 3 SCCM, a flow rate of $O_2$ of 20 SCCM, a flow rate of $CH_4$ of 10 SCCM, an operating pressure of 0.05 Torr, a plasma power of 50 W, and a plasma frequency of 100 kHz and the topcoat film was formed under the same plasma conditions.

In this sample, the undercoat and topcoat films had a thickness of 300 Å and 50 Å, respectively, and both had a silicon content of 20 at %, a O/Si ratio of 2.5, and an index of refraction of 2.0.

Sample No. 9 was prepared by the same procedure as Sample No. 1 except that the undercoat film was formed using tetraethoxysilane (TEOS) and $O_2$ as a reactant gas mixture under plasma polymerization conditions including a flow rate of TEOS of 3 SCCM, a flow rate of $O_2$ of 20 SCCM, an operating pressure of 0.05 Torr, a plasma power of 50 W, and a plasma frequency of 100 kHz and the topcoat film was formed under the same plasma conditions. In this sample, the undercoat and topcoat films had a thickness of 300 Å and 50 Å, respectively, and both had a silicon content of 35 at %, a O/Si ratio of 1.89, and an index of refraction of 1.45.

It is to be noted that the elements contained in the undercoat and topcoat films of Sample Nos. 1 to 9 other than silicon and oxygen were substantially only C and H.

These magnetic recording media, Sample Nos. 1 to 9 were loaded in a 8-mm video deck model S900 (manufactured by Sony K.K.) for the following evaluation.

(1) Δϕm

A saturation magnetization quantity ϕm after one week storage at 80° C. and RH 90% was measured and a difference relative to initial ϕm was determined.

(2) Cupping

After one week storage at 60° C. and RH 90%, the tape was rested on a planar surface to measure a warpage height h of a transverse tape side edge.

It is to be noted that the cupping is a measure indicating the degree of deformation of tape in a transverse direction. With a high cupping, the tape cannot keep a constant spacing to the magnetic head, resulting in output variations.

(3) Change with Time of Dynamic Friction

After one week storage at 80° C. and RH 90%, the tape was measured for a coefficient of dynamic friction μ and a percent increase relative to the initial μ was determined.

The results are shown in Table 1. Table 1 also reports Si content, O/Si ratio, film thickness, and index of refraction.

TABLE 1

| | Undercoat film | | | | | Topcoat film | | | | | | |
|---|---|---|---|---|---|---|---|---|---|---|---|---|
| Sample No. | Reactant gas (flow rate/ SCCM) | Si content (at %) | O/Si | Thickness | Index of refraction | Reactant gas (flow rate/ SCCM) | Si content (at %) | O/Si | Thickness | Index of refraction | Δϕm (memu/ cm$^2$) | Cupping (mm) | Change with time of dynamic friction (%) |
| 1* | TMOS/$O_2$ (3/20) | 35 | 1.85 | 300A | 1.47 | TMOS/$O_2$ (3/20) | 35 | 1.85 | 50A | 1.47 | 0.05 | 0.1 | 3 |
| 2 | TMOS/$O_2$ (3/20) | 35 | 1.85 | 300A | 1.47 | — | — | — | — | — | 1.0 | 1.5 | 100 |
| 3 | — | — | — | — | — | TMOS/$O_2$ (3/20) | 35 | 1.85 | 50A | 1.47 | 0.8 | 1.2 | 100 |
| 4 | — | — | — | — | — | — | — | — | — | — | 2.2 | 3.0 | unmeasurable |
| 5 | TMOS/$O_2$ (20/20) | 55 | 1.1 | 300A | 1.30 | TMOS/$O_2$ (20/20) | 55 | 1.1 | 50A | 1.30 | 0.5 | 1.0 | 50 |
| 6 | TMOS/$O_2$ (3/20) | 35 | 1.85 | 300A | 1.47 | TMOS/$O_2$ (3/20) | 35 | 1.85 | 5A | 1.47 | 0.9 | 1.3 | 80 |
| 7 | TMOS/$O_2$ (3/20) | 35 | 1.85 | 50A | 1.47 | TMOS/$O_2$ (3/20) | 35 | 1.85 | 50A | 1.47 | 0.7 | 1.1 | 90 |
| 8 | TMOS/$O_2$/$CH_4$ (3/20/10) | 20 | 2.5 | 300A | 2.0 | TMOS/$O_2$/$CH_4$ (3/20/10) | 20 | 2.5 | 50A | 2.0 | 1.0 | 1.4 | 130 |
| 9* | TEOS/$O_2$ (3/20) | 35 | 1.89 | 300A | 1.45 | TEOS/$O_2$ (3/20) | 35 | 1.89 | 50A | 1.45 | 0.07 | 0.11 | 5 |

The effectiveness of the present invention is evident from Table 1.

Sample No. 10 was prepared by the same procedure as Sample No. 1 except that the undercoat layer had a thickness in excess of 1000 Å. This sample showed no further improvement of the benefits of the invention and the increased film thickness not only deterred large scale productivity, but also allowed the undercoat film to crack, resulting in a loss of water and oxygen barrier capability.

Sample No. 11 was prepared by the same procedure as Sample No. 1 except that the topcoat layer had a thickness in excess of 100 Å. This sample showed a noticeable spacing loss. Exposure of the magnetic layer to plasma for a sufficiently long time to achieve the increased thickness caused damage to the magnetic layer.

EXAMPLE 2

Sample Nos. 21 to 27 were prepared by the same procedure as Sample No. 1 except that undercoat and topcoat films were formed by using TMOS and $O_2$ as a reactant mix and effecting plasma polymerization as shown in Table 2.

Sample Nos. 21 to 27 and No. 4 of Example 1 were determined for Δϕm as in Example 1. Moisture permeability was also measured by the following procedure. The moisture permeability measured herein is that of the plasma polymerized film itself.

Moisture Permeability

Measurement was made in accordance with JIS Z-0208 in an atmosphere of 60° C. and 90%.

The results are shown in Table 2.

TABLE 2

| Sample No. | Reactant gas (flow rate/ SCCM) | Flow rate ratio (at %) | Si content (at %) | O/Si | Film thickness (Å) Undercoat | Film thickness (Å) Topcoat | $\Delta\phi m$ (memu/cm$^2$) | Moisture permeability*[1] (g/m$^2$ · day) |
|---|---|---|---|---|---|---|---|---|
| 4 | — | — | — | — | — | — | 2.2 | 220 |
| 21 | TMOS/O$_2$ (5/5) | 1 | 55 | 1.1 | 300 | 50 | 2.0 | 220 |
| 22* | TMOS/O$_2$ (5/10) | 0.5 | 37 | 1.5 | 300 | 50 | 0.2 | 60 |
| 23* | TMOS/O$_2$ (5/25) | 0.2 | 35 | 1.85 | 300 | 50 | 0.1 | 40 |
| 24 | TMOS/O$_2$ (5/25) | 0.2 | 35 | 1.85 | — | 50 | 0.8 | 40 |
| 25 | TMOS/O$_2$ (5/25) | 0.2 | 35 | 1.85 | 300 | — | 1.1 | 40 |
| 26* | TMOS/O$_2$ (5/40) | 0.125 | 35 | 1.85 | 300 | 50 | 0.07 | 20 |
| 27 | TMOS/O$_2$ (5/100) | 0.05 | 33 | 2 | 300 | 50 | 0.8 | 100 |

*[1]of the plasma polymerized film itself

The effectiveness of the present invention is evident from Table 2.

EXAMPLE 3

Sample Nos. 31 to 34 were prepared by the same procedure as Sample No. 1 except that undercoat and topcoat films were formed by using TMOS and O$_2$ as a reactant mix and effecting plasma polymerization as shown in Table 3.

Sample Nos. 31 to 34 and No. 4 of Example 1 were determined for $\Delta\phi'm$ and surface quality by the following procedures.

(i) $\Delta\phi'm$

The sample was immersed in a 1N sulfuric acid solution and a voltage of 0.5 volts was applied thereacross for 10 seconds. A saturation magnetization quantity $\phi'm$ was then measured and a difference relative to initial $\phi'm$ was determined. This is a measure indicating a proportion of the magnetic layer dissolved.

(ii) Surface Quality

The sample was immersed in a 1N sulfuric acid solution for 10 minutes and its surface was then observed under an optical microscope and evaluated in five ratings by visual observation.

XX: totally dissolved
X: more than 50% stripped
Δ: more than 30% stripped
O: more than 10% stripped
OO: less than 10% stripped The results are shown in Table 3. It will be understood that Sample No. 33 in Table 3 is identical with Sample No. 23 in Table 2.

TABLE 3

| Sample No. | Reactant gas (flow rate/SCCM) | Si content (at %) | O/Si | Film thickness (Å) Undercoat | Film thickness (Å) Topcoat | $\Delta\phi'm$ (memu/cm$^2$) | Surface quality |
|---|---|---|---|---|---|---|---|
| 4 | — | — | — | — | — | unmeasurable | XX (totally dissolved) |
| 31 | TMOS/O$_2$ (5/25) | 35 | 1.85 | 300 | 5 | 5 | X |
| 32* | TMOS/O$_2$ (5/25) | 35 | 1.85 | 300 | 20 | 0.5 | O |
| 33* | TMOS/O$_2$ (5/25) | 35 | 1.85 | 300 | 50 | 0.3 | O |
| 34* | TMOS/O$_2$ (5/25) | 35 | 1.85 | 300 | 70 | 0.1 | OO |

The effectiveness of the present invention is evident from Table 2.

BENEFITS OF THE INVENTION

The present invention achieves significant improvements in corrosion resistance and durability.

We claim:

1. A magnetic recording medium comprising an undercoat film, a ferromagnetic metal thin film, and a topcoat film on a non-magnetic resin substrate, wherein each of said undercoat film and said topcoat film is a plasma polymerized film containing silicon, the Si content in the films being 30 to 50 at %, said plasma polymerized films contain oxygen and silicon in an atomic ratio O:Si of from 1.2:1 to 1.95:1, said plasma polymerized films are formed by feeding an alkoxysilane compound and oxygen gas as reactants at a flow rate ratio of alkoxysilane compound to oxygen of from 0.1:1 to 0.6:1, said plasm polymerized films have an index of refraction of 1.44 to 1.55, said undercoat film is 100 to 1000 Å thick, and said topcoat film is 10 to 100 Å thick, and wherein said ferromagnetic metal thin film is formed by an oblique evaporation technique.

2. The magnetic recording medium of claim 1, wherein said ferromagnetic metal thin film is predominantly comprised of cobalt.

3. The magnetic recording medium of claim 1, wherein said silicon content in the films is 35 to 45 at. %.

4. The magnetic recording medium of claim 1, wherein the incident angles θmax and θmin of the ferromagnetic material during film formation by said oblique evaporation technique are:

θmax in the range of 80° to 90°

θmin in the range of 10° to 60°.

5. The magnetic recording medium of claim 1, consisting essentially of said undercoat film, ferromagnetic metal thin film, and topcoat film on a non-magnetic resin substrate.

* * * * *

UNITED STATES PATENT AND TRADEMARK OFFICE
CERTIFICATE OF CORRECTION

PATENT NO. : 5,472,778
DATED : December 5, 1995
INVENTOR(S) : Kunihiro UEDA, et al.

It is certified that error appears in the above-indentified patent and that said Letters Patent is hereby corrected as shown below:

On the title page, Item [63], the Related U.S. Application Data should read:

--Continuation of Ser. No. 884,199, May 18, 1992, abandoned.--

Signed and Sealed this

Twenty-sixth Day of March, 1996

Attest:

BRUCE LEHMAN

Attesting Officer

Commissioner of Patents and Trademarks